US012793648B2

(12) United States Patent
Feng et al.

(10) Patent No.: US 12,793,648 B2
(45) Date of Patent: Nov. 10, 2026

(54) SHIFT REGISTER, GATE DRIVING CIRCUIT AND DISPLAY APPARATUS

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 19/147,691

(22) PCT Filed: Jun. 12, 2024

(86) PCT No.: PCT/CN2024/098664
§ 371 (c)(1),
(2) Date: Jul. 12, 2025

(87) PCT Pub. No.: WO2025/020735
PCT Pub. Date: Jan. 30, 2025

(65) Prior Publication Data

US 2026/0221100 A1 Jul. 30, 2026

(30) Foreign Application Priority Data

Jul. 26, 2023 (CN) ......................... 202310936443.0

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2310/0286* (2013.01)

(58) Field of Classification Search
CPC .... G11C 19/28; G09G 3/3208; G09G 3/3233; G09G 2310/0286; G09G 3/3266
See application file for complete search history.

(56) References Cited

U.S. PATENT DOCUMENTS

| | | | | |
|---|---|---|---|---|
| 9,905,192 | B2 * | 2/2018 | Wu | G11C 19/28 |
| 10,373,562 | B2 * | 8/2019 | Zhang | G09G 3/20 |
| 11,328,672 | B2 * | 5/2022 | Feng | G09G 3/3225 |
| 12,125,546 | B2 * | 10/2024 | Wang | G11C 19/28 |
| 2017/0069286 | A1 * | 3/2017 | Wu | G09G 5/18 |
| 2018/0130415 | A1 * | 5/2018 | Zhang | G09G 3/20 |

(Continued)

*Primary Examiner* — Olga V Merkoulova
(74) *Attorney, Agent, or Firm* — IPro, PLLC

(57) ABSTRACT

The present disclosure provides a shift register, a gate driving circuit and a display apparatus, belongs to the field of display technology, and can solve the problem that the shift register in the related art cannot output a forward shift signal. The shift register of the present disclosure includes: a first input sub-circuit, a second input sub-circuit, a first control sub-circuit, a second control sub-circuit, a first cascade sub-circuit, a third control sub-circuit, a first output sub-circuit and a second output sub-circuit; the first output sub-circuit is configured to transmit a second level signal to a signal output terminal in response to a voltage at the first node; the second output sub-circuit is configured to transmit the first clock signal or the first level signal to the signal output terminal in response to a voltage at a cascade signal terminal.

20 Claims, 10 Drawing Sheets

(56) References Cited

U.S. PATENT DOCUMENTS

| | | | | |
|---|---|---|---|---|
| 2021/0201806 | A1* | 7/2021 | Feng | G11C 19/28 |
| 2022/0036798 | A1* | 2/2022 | Feng | G09G 3/2092 |
| 2024/0071312 | A1* | 2/2024 | Shang | G09G 3/3266 |
| 2024/0221850 | A1* | 7/2024 | Wang | G09G 3/3677 |

* cited by examiner

SHIFT REGISTER, GATE DRIVING CIRCUIT AND DISPLAY APPARATUS

TECHNICAL FIELD

The present disclosure relates to the field of display technology, and in particular to a shift register, a gate driving circuit and a display apparatus.

BACKGROUND

With the continuous development of display technology, in recent years, a display is gradually developing towards a trend of high integration and low cost. One very important technology is to realize mass production of a gate driver on array (GOA).

A shift register circuit composed of thin film transistors (TFTs) is integrated on an array substrate of a display substrate by using a GOA for scanning and driving the display substrate, so that a gate driving circuit can be omitted, the product cost, including the material cost and the manufacturing process can be reduced, and the display substrate can be designed to be attractive in narrow border.

SUMMARY

The present disclosure is directed to at least one of the technical problems in the prior art, and provides a shift register, a gate driving circuit and a display apparatus.

In a first aspect, the embodiment of the present disclosure provides a shift register, the shift register includes: a first input sub-circuit, a second input sub-circuit, a first control sub-circuit, a second control sub-circuit, a first cascade sub-circuit, a third control sub-circuit, a first output sub-circuit and a second output sub-circuit;

- the first input sub-circuit is configured to transmit a second level signal to a first node in response to a first clock signal; or transmit a second clock signal to the first node in response to the second clock signal;
- the second input sub-circuit is configured to transmit an input signal to a second node in response to the first clock signal;
- the first control sub-circuit is configured to transmit a first level signal to the first node in response to a voltage at the second node; or transmit the first level signal to the first node and the first input sub-circuit in response to the voltage at the second node;
- the second control sub-circuit is configured to transmit the first level signal to the second node in response to a voltage at the first node and the second clock signal;
- the first cascade sub-circuit is configured to transmit the second clock signal to a cascade signal terminal in response to the voltage at the second node;
- the first output sub-circuit is configured to transmit the second level signal to a signal output terminal in response to the voltage at the first node;
- the second output sub-circuit is configured to transmit the first clock signal or the first level signal to the signal output terminal in response to a voltage at the cascade signal terminal.

In some embodiments, the first input sub-circuit includes: a first transistor; a control electrode of the first transistor is connected to a first clock signal terminal, a first electrode of the first transistor is connected to a second level signal terminal, and a second electrode of the first transistor is connected to the first node.

In some embodiments, the first input sub-circuit includes: a first transistor and a first storage capacitor;

- a control electrode of the first transistor is connected to one terminal of the first storage capacitor, a first electrode of the first transistor is connected to a second clock signal terminal and the other terminal of the first storage capacitor, and a second electrode of the first transistor is connected to the first node;
- the one terminal of the first storage capacitor is connected to the control electrode of the first transistor, and the other terminal of the first storage capacitor is connected to the second clock signal terminal and the first electrode of the first transistor.

In some embodiments, the second input sub-circuit includes: a second transistor;

- a control electrode of the second transistor is connected to a first clock signal terminal, a first electrode of the second transistor is connected to a signal input terminal, and a second electrode of the second transistor is connected to the first control sub-circuit and the second node.

In some embodiments, the first control sub-circuit includes: a fourth transistor and a fourth auxiliary transistor;

- a control electrode of the fourth transistor is connected to the second node and a control electrode of the fourth auxiliary transistor, a first electrode of the fourth transistor is connected to a first level signal terminal, and a second electrode of the fourth transistor is connected to a first electrode of the fourth auxiliary transistor;
- the control electrode of the fourth auxiliary transistor is connected to the second node and the control electrode of the fourth transistor, the first electrode of the fourth auxiliary transistor is connected to the second electrode of the fourth transistor, and a second electrode of the fourth auxiliary transistor is connected to the first node.

In some embodiments, the first control sub-circuit further includes: a fifteenth transistor;

- a control electrode of the fifteenth transistor is connected to the first node, a first electrode of the fifteenth transistor is connected to a second level signal terminal, and a second electrode of the fifteenth transistor is connected to the second electrode of the fourth transistor and the first electrode of the fourth auxiliary transistor.

In some embodiments, the first control sub-circuit includes: a fourth transistor;

- a control electrode of the fourth transistor is connected to the second node, a first electrode of the fourth transistor is connected to a first level signal terminal, and a second electrode of the fourth transistor is connected to the first node.

In some embodiments, the first control sub-circuit includes: a third transistor and a fourth transistor;

- a control electrode of the third transistor is connected to the second node, a first electrode of the third transistor is connected to a first level signal terminal, and a second electrode of the third transistor is connected to the first input sub-circuit;
- a control electrode of the fourth transistor is connected to the second node, a first electrode of the fourth transistor is connected to the first level signal terminal, and a second electrode of the fourth transistor is connected to the first node.

In some embodiments, the second control sub-circuit includes: a fifth transistor and a sixth transistor;

- a control electrode of the fifth transistor is connected to the first node, a first electrode of the fifth transistor is connected to a first level signal terminal, and a second electrode of the fifth transistor is connected to a first electrode of the sixth transistor;

a control electrode of the sixth transistor is connected to a second clock signal terminal, the first electrode of the sixth transistor is connected to the second electrode of the fifth transistor, and a second electrode of the sixth transistor is connected to the second node.

In some embodiments, the first cascade sub-circuit includes: a seventh transistor, an eighth transistor, and a second storage capacitor;

a control electrode of the seventh transistor is connected to a second level signal terminal, a first electrode of the seventh transistor is connected to the second node, and a second electrode of the seventh transistor is connected to a control electrode of the eighth transistor and one terminal of the second storage capacitor;

the control electrode of the eighth transistor is connected to the second electrode of the seventh transistor and the one terminal of the second storage capacitor, a first electrode of the eighth transistor is connected to a second clock signal terminal, and a second electrode of the eighth transistor is connected to the cascade signal terminal and the other terminal of the second storage capacitor.

In some embodiments, the first output sub-circuit includes: an eleventh transistor and a third storage capacitor;

a control electrode of the eleventh transistor is connected to the first node and one terminal of the third storage capacitor, a first electrode of the eleventh transistor is connected to a second level signal terminal, and a second electrode of the eleventh transistor is connected to the signal output terminal;

the one terminal of the third storage capacitor is connected to the first node and the control electrode of the eleventh transistor, and the other terminal of the third storage capacitor is connected to the first electrode of the eleventh transistor and the second level signal terminal, or is connected to a first clock signal terminal.

In some embodiments, the first output sub-circuit further includes: a twelfth transistor;

a control electrode of the twelfth transistor is connected to the second level signal terminal, a first electrode of the twelfth transistor is connected to the first node, and a second electrode of the twelfth transistor is connected to the one terminal of the third storage capacitor and the control electrode of the eleventh transistor.

In some embodiments, the second output sub-circuit includes: a thirteenth transistor and a fourth storage capacitor;

a control electrode of the thirteenth transistor is connected to the cascade signal terminal and one terminal of the fourth storage capacitor, a first electrode of the thirteenth transistor is connected to a first clock signal terminal or a first level signal terminal, and a second electrode of the thirteenth transistor is connected to the signal output terminal and the other terminal of the fourth storage capacitor;

the one terminal of the fourth storage capacitor is connected to the cascade signal terminal and the control electrode of the thirteenth transistor, and the other terminal of the fourth storage capacitor is connected to the second electrode of the thirteenth transistor and the signal output terminal.

In some embodiments, the second output sub-circuit further includes: a fourteenth transistor;

a control electrode of the fourteenth transistor is connected to a second level signal terminal, a first electrode of the fourteenth transistor is connected to the signal output terminal, and a second electrode of the fourteenth transistor is connected to the one terminal of the fourth storage capacitor and the control electrode of the thirteenth transistor.

In some embodiments, the shift register further includes: a third control sub-circuit; and the third control sub-circuit is configured to transmit the first level signal to the cascade signal terminal in response to the voltage at the first node and the second clock signal;

In some embodiments, the third control sub-circuit includes: a ninth transistor and a tenth transistor;

a control electrode of the ninth transistor is connected to the second node, a first electrode of the ninth transistor is connected to a second clock signal terminal, and a second electrode of the ninth transistor is connected to a second electrode of the tenth transistor and the second output sub-circuit;

a control electrode of the tenth transistor is connected to the first node, a first electrode of the tenth transistor is connected to a first level signal terminal, and the second electrode of the tenth transistor is connected to the second electrode of the ninth transistor and the second output sub-circuit.

In some embodiments, the third control sub-circuit includes: a ninth transistor and a tenth transistor;

a control electrode of the ninth transistor is connected to the first node, a first electrode of the ninth transistor is connected to a first level signal terminal, and a second electrode of the ninth transistor is connected to a first electrode of the tenth transistor;

a control electrode of the tenth transistor is connected to a second clock signal terminal, the first electrode of the tenth transistor is connected to the second electrode of the ninth transistor, and a second electrode of the tenth transistor is connected to the second output sub-circuit and the cascade signal terminal.

In some embodiments, the third control sub-circuit includes: a tenth transistor;

a control electrode of the tenth transistor is connected to a second clock signal terminal, a first electrode of the tenth transistor is connected to the second control sub-circuit, and a second electrode of the tenth transistor is connected to the second output sub-circuit and the cascade signal terminal.

In some embodiments, the shift register further includes: a second cascade sub-circuit;

the second cascade sub-circuit is configured to transmit the first level signal to the cascade signal terminal in response to the voltage at the first node.

In some embodiments, the second cascade sub-circuit includes: a sixteenth transistor and a fifth storage capacitor;

a control electrode of the sixteenth transistor is connected to the first node and one terminal of the fifth storage capacitor, a first electrode of the sixteenth transistor is connected to a first level signal terminal and the other terminal of the fifth storage capacitor, and a second electrode of the sixteenth transistor is connected to the cascade signal terminal.

In a second aspect, embodiments of the present disclosure provide a method for driving the shift register as provided in the above embodiments, the method includes:

transmitting the second level signal to the first node in response to the first clock signal;

transmitting the input signal to the second node in response to the first clock signal;

transmitting the first level signal to the first node in response to the voltage at the second node;

transmitting the first level signal to the second node in response to the voltage at the first node and the second clock signal;

transmitting the second clock signal to the cascade signal terminal in response to the voltage at the second node;

transmitting the second level signal to the signal output terminal in response to the voltage at the first node; and transmitting the first clock signal or the first level signal to the signal output terminal in response to the voltage at the cascade signal terminal.

In a third aspect, embodiments of the present disclosure provide a gate driving circuit, the gate driving circuit includes: a plurality of shift registers, which are cascaded together, and each of which is the shift register as provided in the above embodiments;

the signal input terminal of the shift register in a current stage is connected to the signal output terminal of the shift register in a previous stage.

In a fourth aspect, embodiments of the present disclosure provide a display apparatus, and the display apparatus includes the gate driving circuit as provided in the above embodiments.

DETAIL DESCRIPTION OF EMBODIMENTS

Figure 1:
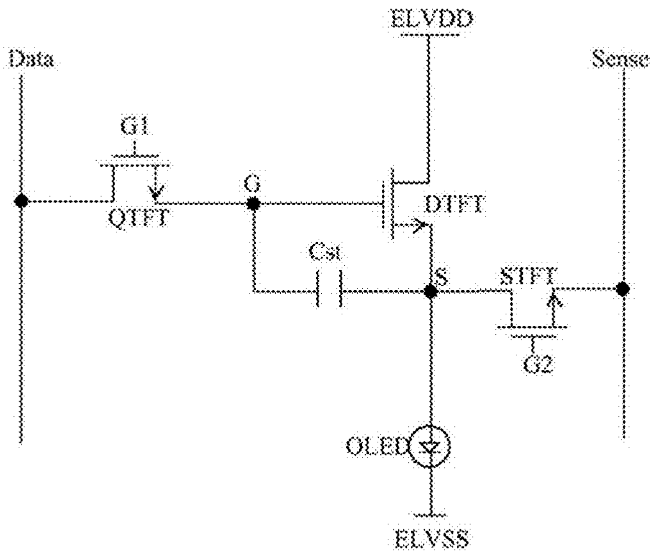
FIG. 1 is a schematic diagram of a structure of an exemplary pixel circuit.

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms “first”, “second”, and the like used in the present disclosure are not intended to indicate any order, quantity, or importance, but rather are used for distinguishing one element from another. Similarly, the terms “a,” “an,” or “the” and similar referents do not denote a limitation of quantity, but rather denote the presence of at least one element. Similarly, the term “comprising”, “including”, or the like means that the element or item preceding the term contains the element or item listed after the term and its equivalent, but does not exclude other elements or items. The term “connected”, “coupled”, or the like is not limited to physical or mechanical connections, but may include electrical connections, whether direct or indirect connections. The terms “upper”, “lower”, “left”, “right”, and the like are used only for indicating relative positional relationships, and when the absolute position of an object being described is changed, the relative positional relationships may also be changed accordingly.

It should be noted that transistors used in the embodiments of the present disclosure may be thin film transistors or field effect transistors or other devices with the same characteristics. In this embodiment, the coupling of a drain electrode and a source electrode of each transistor may be interchanged with each other, and therefore, there is no difference between the source electrode and the drain electrode in the embodiments of the present disclosure. Here, only in order to distinguish two electrodes of a transistor except for a control electrode (i.e., a gate electrode), one of the electrodes is referred to as a drain electrode, and the other electrode is referred to as a source electrode. The thin film transistors adopted in the embodiment of the present disclosure are all P-type transistors. A first electrode may be a source electrode and a second electrode may be a drain electrode. In the P-type transistor, when a low level is input to a gate electrode, a source electrode and a drain electrode are electrically connected to each other, and when a high level is input to the gate electrode, the source electrode and the drain electrode are electrically disconnected from each other.

In the present disclosure, “a first level signal” refers to a high level signal, “a second level signal” refers to a low level signal, and both a first clock signal and a second clock signal are pulse signals with a certain duty ratio, the high level signal in the first clock signal corresponds to the low level signal of the second clock signal, and potentials of the first clock signal and the second clock signal are opposite to each other in the same phase.

Figure 2:
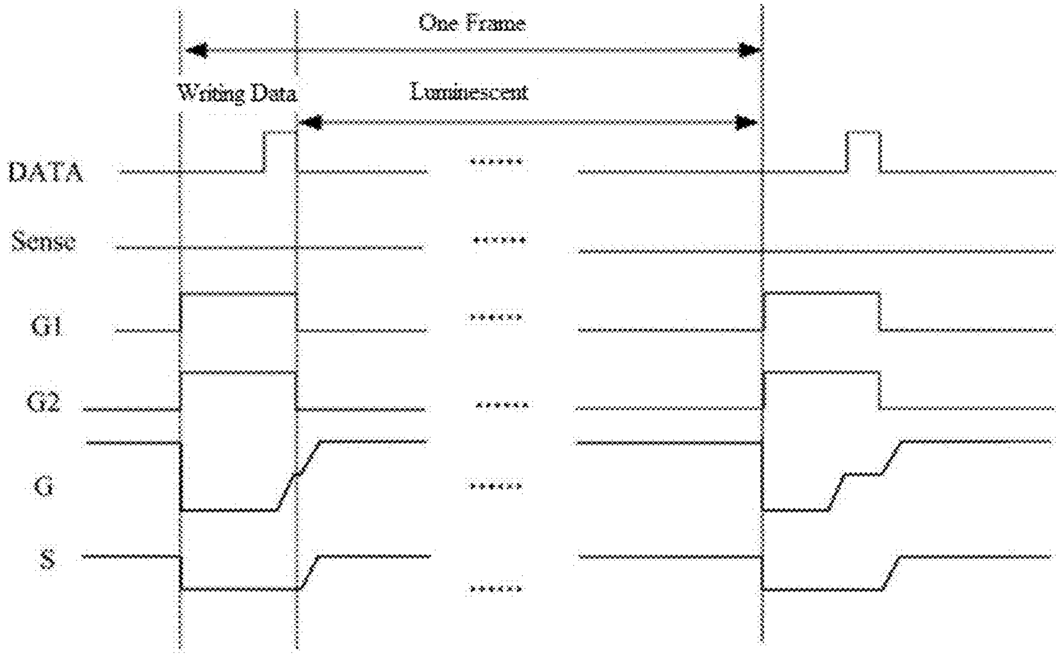
FIG. 2 is a timing diagram illustrating an operation of the pixel circuit shown in FIG. 1.

FIG. 1 is a schematic diagram of a structure of an exemplary pixel circuit. FIG. 2 is a timing diagram illustrating an operation of the pixel circuit shown in FIG. 1. As shown in FIG. 1, the pixel circuit includes: a data writing transistor QTFT, a driving transistor DTFT, a sensing transistor STFT, a storage capacitor Cst, and a light emitting device OLED.

The data writing transistor QTFT has a gate electrode connected to a first gate line G1, a source electrode connected to a data signal line Data, and a drain electrode connected to a first node G. The driving transistor DTFT has a gate electrode connected to the first node G, a source electrode connected to a first power voltage terminal ELVDD, and a drain electrode connected to a second node S. The storage capacitor Cst has one terminal connected to the first node G and the other terminal connected to the second node S. The sensing transistor STFT has a gate electrode connected to a second gate line G2, a source electrode connected to a sensing signal line Sense, and a drain electrode connected to the second node S. The light emitting device OLED has an anode connected to the second node S, and a cathode connected to a second power voltage terminal ELVSS.

Referring to FIG. 2, the operation of the pixel circuit includes: a data writing phase and a luminescent phase. In the data writing phase, the first gate line G1 controls the gate electrode of the data writing transistor QTFT so that the source electrode and the drain electrode of the data writing transistor QTFT are electrically connected to each other, and a data line Data writes a data voltage Vdata to the gate electrode (the first node G) of the driving transistor DTFT. In the luminescent phase, the driving transistor DTFT outputs a corresponding driving current according to a voltage at the control electrode of the driving transistor DTFT to drive the light emitting device OLED to emit light. The operation of the pixel circuit further includes: a sensing phase (not shown). The sensing phase is after one frame of display time, in the sensing phase, the sensing transistor STFT senses the driving transistor DTFT and the light emitting device OLED in the pixel circuit, and performs an external compensation on the pixel circuit with a sensing result. The specific external compensation process belongs to the conventional technology in the field, and is not described in detail here.

Gate driving signals of the first gate line G1 and the second gate line G2 shown in FIG. 2 are provided by a gate driving circuit including a plurality of cascaded shift registers, and in order to implement a narrow border design and reduce an area occupied by the gate driving circuit, the transistors may all be P-type transistors.

Figure 3:
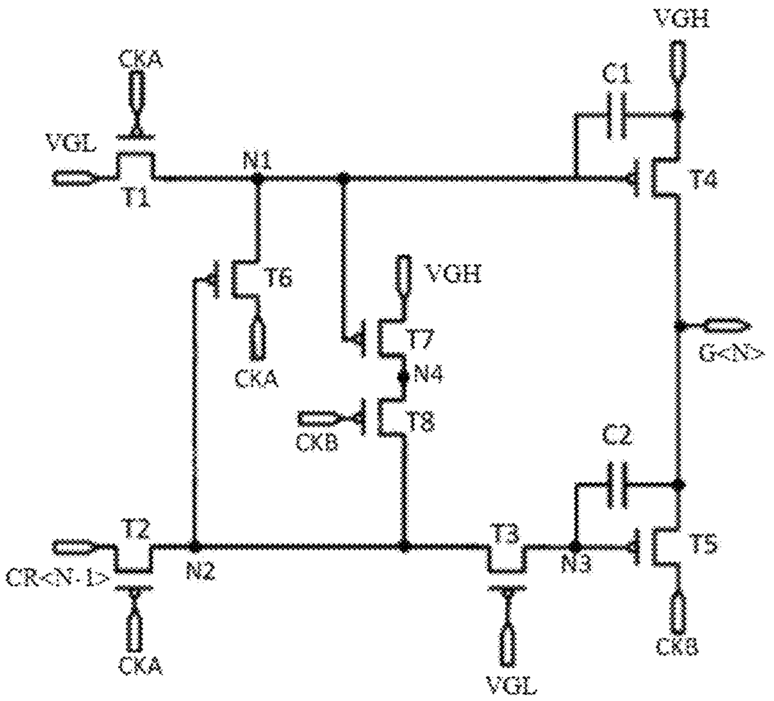
FIG. 3 is a schematic diagram of a structure of an exemplary shift register.

FIG. 3 is a schematic diagram of a structure of an exemplary shift register. As shown in FIG. 3, the shift register includes: a first transistor T1 to an eighth transistor T8, and a first storage capacitor C1 and a second storage capacitor C2. The first transistor T1 to the eighth transistor T8 are all low temperature poly-silicon (LTPS) thin film transistors (TFTs), i.e., P-type TFTs, with a negative threshold voltage Vth. When a voltage difference between the gate electrode and source electrode of the TFT is Vgs<Vth, the TFT is turned on. The shift register is used for outputting the gate driving signals of the first gate line G1 and the second gate line G2 required for driving the pixel circuit shown in FIG. 1.

A source electrode of the first transistor T1 is connected to a low level signal terminal VGL, a gate electrode of the first transistor T1 is connected to a first clock signal terminal CKA, and a drain electrode of the first transistor T1 is connected to a first node N1. A source electrode of the second transistor T2 is connected to a signal input terminal, which may be a cascade signal terminal CR<N−1> in the previous stage, a gate electrode of the second transistor T2 is connected to the first clock signal terminal CKA, and a drain electrode of the second transistor T2 is connected to a second node N2. A source electrode of the third transistor T3 is connected to the second node N2, a gate electrode of the third transistor T3 is connected to the low level signal terminal VGL, and a drain electrode of the third transistor T3 is connected to a third node N3. A source electrode of the fourth transistor T4 is connected to a high level signal terminal VGH, a gate electrode of the fourth transistor T4 is connected to the first node N1, and a drain electrode of the fourth transistor T4 is connected to a signal output terminal G<N> of the shift register. A source electrode of the fifth transistor T5 is connected to a second clock signal terminal CKB, a gate electrode of the fifth transistor T5 is connected to the third node N3, and a drain electrode of the fifth transistor T5 is connected to the signal output terminal G<N> of the shift register. A source electrode of the sixth transistor T6 is connected to the first clock signal terminal CKA, a gate electrode of the sixth transistor T6 is connected to the second node N2, and a drain electrode of the sixth transistor T6 is connected to the drain electrode of the first transistor T1. A source electrode of the seventh transistor T7 is connected to the high level signal terminal VGH, a gate electrode of the seventh transistor T7 is connected to the first node N1, and a drain electrode of the seventh transistor T7 is connected to a fourth node N4. A source electrode of the eighth transistor T8 is connected to the fourth node N4, a gate electrode of the eighth transistor T8 is connected to the second clock signal terminal CKB, and a drain electrode of the eighth transistor T8 is connected to the second node N2. Two terminals of the first storage capacitor C1 are connected to the gate electrode and the source electrode of the fourth transistor T4, respectively. Two terminals of the second storage capacitor C2 are connected to the gate electrode and the drain electrode of the fifth transistor T5, respectively.

Figure 4:
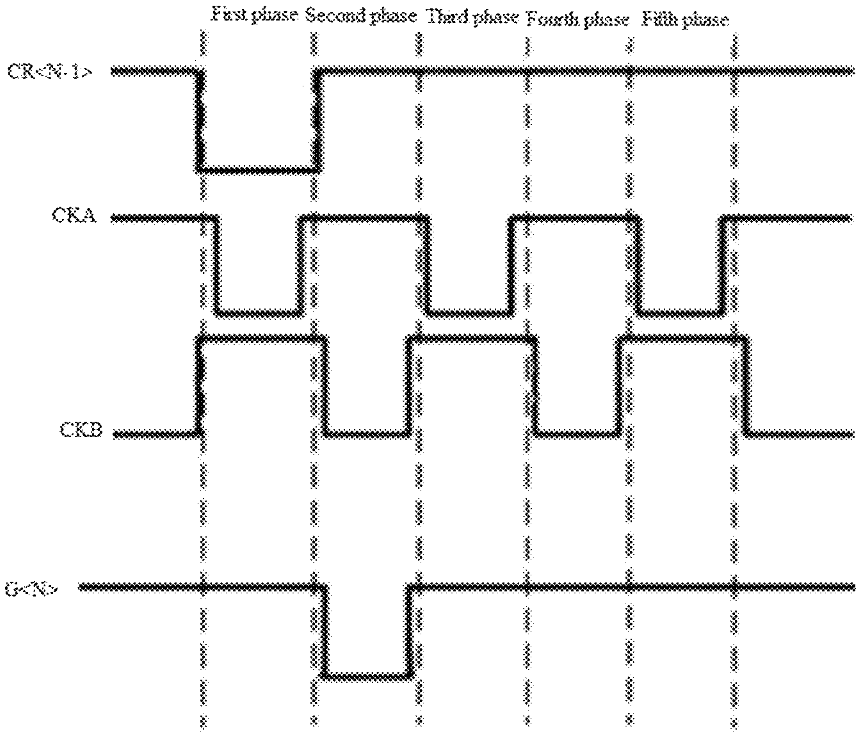
FIG. 4 is a timing diagram illustrating an operation of the shift register shown in FIG. 3.

FIG. 4 is a timing diagram illustrating an operation of the shift register shown in FIG. 3. As shown in FIG. 4, the operation process of the shift register is divided into a first phase, a second phase, a third phase, a fourth phase and a fifth phase.

In the first phase: a first clock signal and a cascade signal of the previous stage are both at a low level (an effective level), and a second clock signal is at a high level (an ineffective level). The first transistor T1 and the second transistor T2 are turned on under the control of the first clock signal, the cascade signal of the previous stage is input through the drain electrode of the second transistor T2, the low level signal is written into the second node N2, the third transistor T3 is turned on under the control of the low level signal, and the low level signal written into the second node N2 is continuously written into the third node N3, so that the fifth transistor T5 is turned on. The second clock signal (at a high level) is input through the drain electrode of the fifth transistor T5, and the signal output terminal G<N> of the shift register outputs the high level signal. Meanwhile, the low level signal is input through the drain electrode of the first transistor T1, and is written into the first node N1, so that the fourth transistor T4 is turned on. The high level signal is input through the drain electrode of the fourth transistor T4, and the first node N1 is at a low level, so that the seventh transistor T7 is turned on. Meanwhile, the second clock signal is at a high level, so that the eighth transistor T8 is turned off, and at this time, the signal output terminal G<N> of the shift register outputs the high level signal.

In the second phase: the first clock signal and the cascade signal of the previous stage are both at a high level (an ineffective level), and the second clock signal is at a low level (an effective level). The third node N3 (under the action of the second storage capacitor C2) maintains the low level in the first phase, so that the fifth transistor T5 remains turned on, and after the second clock signal is switched, the signal output terminal G<N> of the shift register outputs the low level signal at this time. Meanwhile, the second node N2 (under the action of the first storage capacitor C1) maintains the low level in the first phase, so that the sixth transistor T6 is turned on, the first clock signal is input through the drain electrode of the sixth transistor T6, and is written into the first node N1, and therefore, a voltage at the first node N1 is pulled up, and the fourth transistor T4 and the seventh transistor T7 are turned off.

In the third phase: the first clock signal is at a low level (an effective level), and the cascade signal and the second clock signal of the previous stage are both at a high level (an ineffective level). The first transistor T1 and the second transistor T2 are turned on under the control of the first clock signal, the cascade signal of the previous stage is input through the drain electrode of the second transistor T2, the high level signal is sequentially written into the second node N2 and the third node N3, and the fifth transistor T5 is turned off. Meanwhile, the low level signal is input through the drain electrode of the first transistor T1, and is written into the first node N1, so that the fourth transistor T4 is turned on. The high level signal is input through the drain electrode of the fourth transistor T4, and at this time, the signal output terminal G<N> of the shift register outputs the high level signal.

In the fourth phase: the first clock signal and the cascade signal of the previous stage are both at a high level (an ineffective level), and the second clock signal is at a low level (an effective level). The second node N2 and the third node N3 both maintain the high level in the third phase (under the action of the second storage capacitor C2), so that the fifth transistor T5 and the sixth transistor T6 are both turned off. The first node N1 maintains the low level in the third phase (under the action of the first storage capacitor C1), so that the fourth transistor T4 is turned on, the high level signal is input through the drain electrode of the fourth transistor T4, and at this time, the signal output terminal G<N> of the shift register outputs the high level signal.

In the fifth phase: the first clock signal is at a low level (an effective level), and the cascade signal of the previous stage and the second clock signal are both at a high level (an ineffective level). The first transistor T1 and the second transistor T2 are turned on under the control of the first clock signal, the cascade signal of the previous stage is input through the drain electrode of the second transistor T2, and the high level signal is sequentially written into the second node N2 and the third node N3, so that the fifth transistor T5 is turned off. Meanwhile, the low level signal is input through the drain electrode of the first transistor T1, and the low level signal is input to the first node N1, so that the fourth transistor T4 is turned on. The high level signal is input through the drain electrode of the fourth transistor T4, and at this time, the signal output terminal G<N> of the shift register outputs the high level signal.

It can be seen that for the gate driving signal output by the signal output terminal G<N> of the shift register shown in FIG. 3, the low level signal is the effective level signal, which does not satisfy a waveform of the forward shift signals of the first gate line G1 and the second gate line G2 shown in FIG. 2.

In order to solve at least one of the above technical problems, embodiments of the present disclosure provide a shift register, a gate driving circuit and a display apparatus, which will be described in further detail with reference to the accompanying drawings and detailed description.

Figure 5:
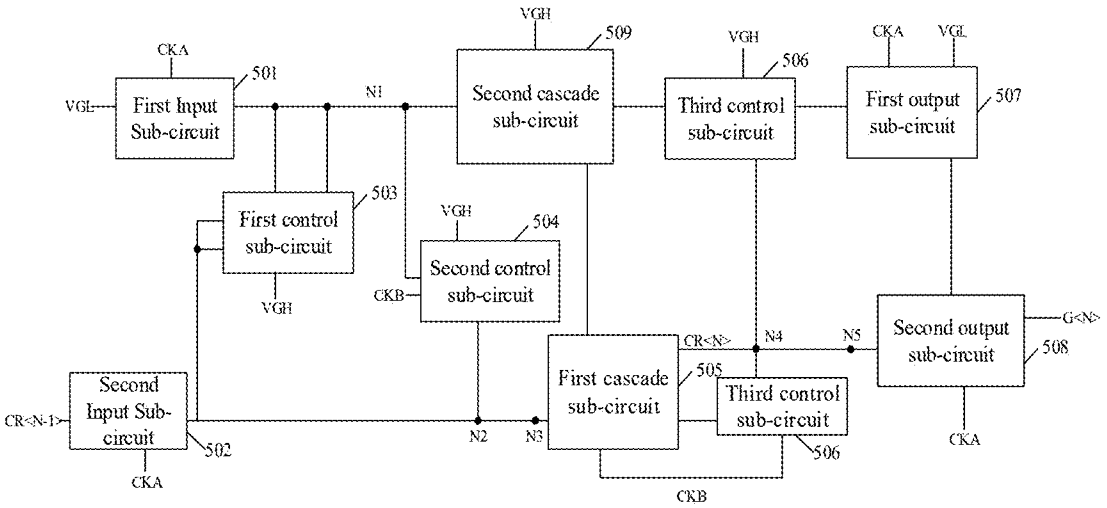
FIG. 5 is a schematic block diagram of a shift register according to an embodiment of the present disclosure.

In a first aspect, an embodiment of the present disclosure provides a shift register. FIG. 5 is a schematic block diagram of a shift register according to an embodiment of the present disclosure. As shown in FIG. 5, the shift register includes: a first input sub-circuit 501, a second input sub-circuit 502, a first control sub-circuit 503, a second control sub-circuit 504, a first cascade sub-circuit 505, a first output sub-circuit 507, and a second output sub-circuit 508. The first input sub-circuit 501 is configured to transmit a low level signal to the first node N1 in response to a first clock signal; or transmit the second clock signal to the first node N1 in response to a second clock signal. The second input sub-circuit 502 is configured to transmit the input signal to a second node N2 in response to the first clock signal. The first control sub-circuit 503 is configured to transmit a high level signal to the first node N1 in response to the voltage at the second node N2; or transmit a high level signal to the first node N1 and the first input sub-circuit 501 in response to the voltage at the second node N2. The second control sub-circuit 504 is configured to transmit a high level signal to the second node N2 in response to the voltage at the first node N1 and the second clock signal. The first cascade sub-circuit 505 is configured to transmit the second clock signal to a cascade signal terminal CR<N> in response to the voltage at the second node N2. The first output sub-circuit 507 is configured to transmit a low level signal to a signal output terminal G<N> in response to the voltage at the first node N1. The second output sub-circuit 508 is configured to transmit the first clock signal or the high level signal to the signal output terminal G<N> in response to the voltage at the cascade signal terminal CR<N>.

In the shift register provided by the embodiment of the present disclosure, the first input sub-circuit 501 may transmit the low level signal or the second clock signal to the first node N1, the second input sub-circuit 502 may transmit the input signal to the second node N2, where the input signal may specifically be the cascade signal of the previous stage or an initial signal (e.g., STV), and the first control sub-circuit 503 and the second control sub-circuit 504 may adjust potentials at the first node N1 and the second node N2, so that the cascade signal terminal CR<N> connected to the first cascade sub-circuit 505 outputs a cascade signal with a first timing, where the low level signal is an effective level signal for the cascade signal. The signal output terminal connected to the first output sub-circuit 507 and the second output sub-circuit 508 outputs an output signal having the second timing. In the same phase, the potential of the output signal having the second timing is opposite to the potential of the cascade signal having the first timing. In this way, the output signal can be controlled in an inverted state so that the output signal satisfies the waveform of the forward shift signals of the first gate line G1 and the second gate line G2 shown in FIG. 2.

In some embodiments, as shown in FIG. 5, the shift register further includes: a second cascade sub-circuit 509 configured to transmit the first level signal to the cascade signal terminal CR<N> in response to the voltage at the first node N1.

The shift register provided in the embodiments of the present disclosure will be described in further detail below with reference to a specific circuit structure and a timing.

Figure 6:
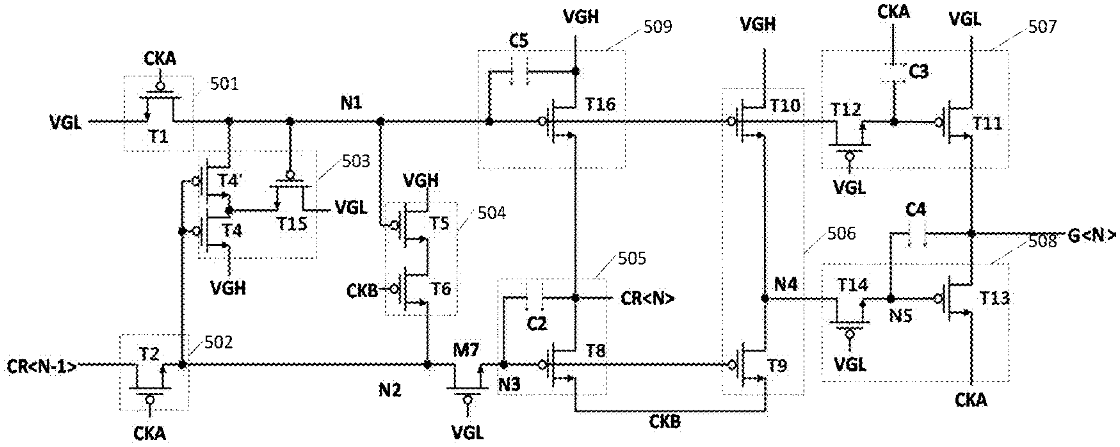
FIG. 6 is a schematic diagram of a first circuit structure of a shift register according to an embodiment of the present disclosure.

FIG. 6 is a schematic diagram of a first circuit structure of a shift register according to an embodiment of the present disclosure. As shown in FIG. 6, the first input sub-circuit 501 includes: a first transistor T1; the first transistor T1 has a gate electrode connected to the first clock signal terminal CKA, a source electrode connected to the second level signal terminal VGL, and a drain electrode connected to the first node N1.

The second input sub-circuit 502 includes: a second transistor T2; the second transistor T2 has a gate electrode connected to the first clock signal terminal CKA, a source electrode connected to a signal input terminal CR<N−1>, and a drain electrode connected to the first control sub-circuit 503 and the second node N2.

The first control sub-circuit 503 includes: a fourth transistor T4 and a fourth auxiliary transistor T4'; the fourth transistor T4 has a gate electrode connected to the second node N2 and a gate electrode of the fourth auxiliary transistor T4', a source electrode connected to the first level signal terminal VGH, and a drain electrode connected to a source electrode of the fourth auxiliary transistor T4'; the fourth auxiliary transistor T4' has the gate electrode connected to the second node N2 and the gate electrode of the fourth transistor T4, the source electrode connected to the drain electrode of the fourth transistor T4, and a drain electrode connected to the first node N1. The first control sub-circuit 503 further includes: a fifteenth transistor T15; the fifteenth transistor T15 has a gate electrode connected to the first node N1, a source electrode connected to the second level signal terminal VGL, and a drain electrode connected to the drain electrode of the fourth transistor T4 and the source electrode of the fourth auxiliary transistor T4'.

The second control sub-circuit 504 includes: a fifth transistor T5 and a sixth transistor T6; the fifth transistor T5 has a gate electrode connected to the first node N1, a source electrode connected to the first level signal terminal VGH, and a drain electrode connected to a source electrode of the sixth transistor T6; the sixth transistor T6 has a gate electrode connected to the second clock signal terminal CKB, the source electrode connected to the drain electrode of the fifth transistor T5, and a drain electrode connected to the second node N2.

The first cascade sub-circuit 505 includes: a seventh transistor T7, an eighth transistor T8, and a second storage capacitor C2; the seventh transistor T7 has a gate electrode connected to the second level signal terminal VGL, a source electrode connected to the second node N2, and a drain electrode connected to a gate electrode of the eighth transistor T8 and one terminal of the second storage capacitor C2; the eighth transistor T8 has the gate electrode connected to the drain electrode of the seventh transistor T7 and one terminal of the second storage capacitor C2, a source electrode connected to the second clock signal terminal CKB, and a drain electrode connected to the cascade signal terminal CR<N> and other terminal of the second storage capacitor C2. A connection point among the drain electrode of the seventh transistor T7, the gate electrode of the eighth transistor T8, and one terminal of the second storage capacitor C2 is a third node N3.

The third control sub-circuit 506 includes: a ninth transistor T9 and a tenth transistor T10; the ninth transistor T9 has a gate electrode connected to the second node N2, a source electrode connected to the second clock signal terminal CKB, and a drain electrode connected to a drain electrode of the tenth transistor T10 and the second output sub-circuit 508; the tenth transistor T10 has a gate electrode connected to the first node N1, a source electrode connected to the first level signal terminal VGH, and the drain electrode connected to the drain electrode of the ninth transistor T9 and the second output sub-circuit 508. A connection point among the drain electrode of the ninth transistor T9, the drain electrode of the tenth transistor T10, and the second output sub-circuit 508 is a fourth node N4.

The first output sub-circuit 507 includes: an eleventh transistor T11 and a third storage capacitor C3; the eleventh transistor T11 has a gate electrode connected to the first node N1 and one terminal of the third storage capacitor C3, a source electrode connected to the second level signal terminal VGL, and a drain electrode is connected to the signal output terminal G<N>; one terminal of the third storage capacitor C3 connected to the first node N1 and the gate electrode of the eleventh transistor T11, and the other terminal of the third storage capacitor C3 is connected to the first clock signal terminal CLKA.

The first output sub-circuit 507 further includes: a twelfth transistor T12; the twelfth transistor T12 has a gate electrode connected to the second level signal terminal VGL, a source electrode connected to the first node N1, and a drain electrode connected to one terminal of the third storage capacitor C3 and the gate electrode of the eleventh transistor T11.

The second output sub-circuit 508 includes: a thirteenth transistor T13 and a fourth storage capacitor C4; the thirteenth transistor T13 has a gate electrode connected to a fifth node N5 and one terminal of the fourth storage capacitor C4, a source electrode connected to the first clock signal terminal CKA, and a drain electrode connected to the signal output terminal G<N> and the other terminal of the fourth storage capacitor C4; one terminal of the fourth storage capacitor C4 is connected to the fifth node N5 and the gate electrode of the thirteenth transistor T13, and the other terminal of the fourth storage capacitor C4 is connected to the drain electrode of the thirteenth transistor T13 and the signal output terminal G<N>.

The second output sub-circuit 508 further includes: a fourteenth transistor T14; the fourteenth transistor has a gate electrode connected to the second level signal terminal VGL, a source electrode connected to the fourth node N4, and a drain electrode connected to the fifth node N5.

It can be seen that the fourth node N4 and the fifth node N5 are respectively connection points of the source electrode and the drain electrode of the fourteenth transistor T14. The gate electrode of the fourteenth transistor T14 is connected to the low level signal terminal VGL, so that the source electrode and the drain electrode of the fourteenth transistor T14 are always electrically connected to each other, and potentials at the fourth node N4 and the fifth node N5 are the same. Furthermore, the source electrodes of the eighth transistor T8 and the ninth transistor T9 are connected to the same signal terminal, the gate electrodes of the eighth transistor T8 and the ninth transistor T9 are connected to the same signal terminal, the drain electrode of one of the eighth transistor T8 and the ninth transistor T9 is connected to the cascade signal terminal CR<N>, and the drain electrode of the other is connected to the fourth node N4. Therefore, the potentials at the cascade signal terminal CR<N>, the fourth node N4 and the fifth node N5 are also the same.

The second cascade sub-circuit 509 includes: a sixteenth transistor T16 and a fifth storage capacitor C5; the sixteenth transistor T16 has a gate electrode connected to the first node N1 and one terminal of the fifth storage capacitor C5, a source electrode connected to the first level signal terminal VGH and the other terminal of the fifth storage capacitor C5, and a drain electrode connected to the cascade signal terminal CR<N>.

Figure 7:
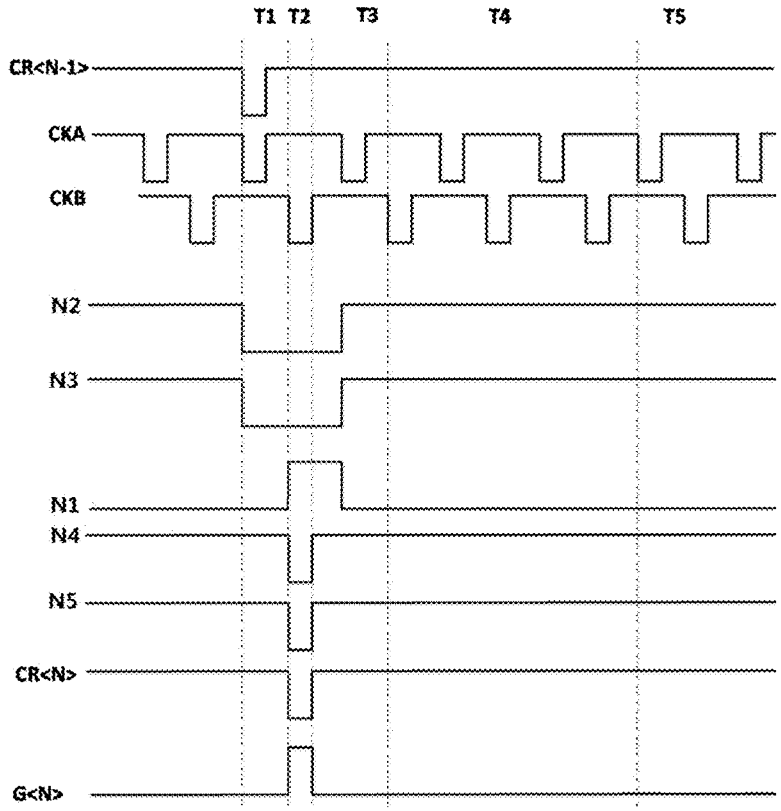
FIG. 7 is a timing diagram illustrating an operation of the shift register shown in FIG. 6.

FIG. 7 is a timing diagram illustrating an operation of the shift register shown in FIG. 6. As shown in FIG. 7, the operation of the shift register is divided into a first phase, a second phase, a third phase, a fourth phase and a fifth phase.

In the first phase: a first clock signal and a cascade signal of the previous stage are both at a low level (an effective level), and a second clock signal is at a high level (an ineffective level). The first transistor T1 and the second transistor T2 are turned on under the control of the first clock signal, the cascade signal of the previous stage is input through the drain electrode of the second transistor T2, the low level signal is written into the second node N2, the seventh transistor T7 is turned on under the control of the low level signal, and the low level signal written into the second node N2 is continuously written into the third node N3, so that the eighth transistor T8 is turned on. The second clock signal (at a high level) is input through the drain electrode of the eighth transistor T8, and the cascade signal terminal CR<N> of the shift register outputs the high level signal. Meanwhile, the low level signal is input through the drain electrode of the first transistor T1, and is written into the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned on under the control of the voltage at the third node N3, the tenth transistor T10 is turned on under the control of the voltage at the first node N1, the second clock signal (at a high level) is input to the fourth node N4 through the drain electrode of the ninth transistor T9, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the second phase: the first clock signal and the cascade signal of the previous stage are both at a high level (an ineffective level), and the second clock signal is at a low level (an effective level). The third node N3 (under the action of the second storage capacitor C2) maintains the low level in the first phase, so that the eighth transistor T8 remains turned on, and after the second clock signal is switched, the cascade signal terminal CR<N> of the shift register outputs the low level signal at this time. Meanwhile, the second node N2 (under the action of the second storage capacitor C2) maintains the low level in the first phase, so that the fourth transistor T4 and the fourth auxiliary transistor T4' are turned on, the high level signal is input through the drain electrode of the fourth auxiliary transistor T4', and is written into the first node N1, and therefore, a voltage at the first node N1 is pulled up, and the fifth transistor T5, the sixteenth transistor T16, the tenth transistor T10 and the eleventh transistor T11 are turned off. The ninth transistor T9 is turned on under the control of the voltage at the third node N3, and the second clock signal (at a low level) is input to the fourth node N4 through the drain electrode of the ninth transistor T9. The fourteenth transistor T14 is turned on under the control of the low level signal, so that the voltage at the fourth node N4 is transmitted to the gate electrode of the thirteenth transistor T13, and the thirteenth transistor T13 is turned on. The first clock signal (at a high level) is input through the drain electrode of the thirteenth transistor T13, and the signal output terminal G<N> of the shift register outputs the high level signal.

In the third phase: the first clock signal is at a low level (an effective level), and the cascade signal and the second clock signal of the previous stage are both at a high level (an ineffective level). The first transistor T1 and the second transistor T2 are turned on under the control of the first clock signal, the cascade signal of the previous stage is input through the drain electrode of the second transistor T2, the high level signal is sequentially written into the second node N2 and the third node N3, and the eighth transistor T8 is turned off. Meanwhile, the low level signal is input through the drain electrode of the first transistor T1, and is written into the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the fourth phase: the first clock signal and the cascade signal of the previous stage are both at a high level (an ineffective level), and the second clock signal is at a low level (an effective level). The second node N2 and the third node N3 both maintain the high level in the third phase (under the action of the second storage capacitor C2), so that the eighth transistor T8, the fourth transistor T4 and the fourth auxiliary transistor T4' are turned off. The first node N1 maintains the low level in the third phase (under the action of the fifth storage capacitor C5), so that the sixteenth transistor T16 is turned on, the high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the fifth phase: the first clock signal is at a low level (an effective level), and the cascade signal of the previous stage and the second clock signal are both at a high level (an ineffective level). The first transistor T1 and the second transistor T2 are turned on under the control of the first clock signal, the cascade signal of the previous stage is input through the drain electrode of the second transistor T2, and the high level signal is sequentially written into the second node N2 and the third node N3, so that the eighth transistor T8 is turned off. Meanwhile, the low level signal is input through the drain electrode of the first transistor T1, and the low level signal is input to the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

It can be seen from the circuit structure and the operation timing of the shift register that in the shift register provided in the embodiment of the present disclosure, in the same phase, the potential of the output signal of the output signal terminal G<N> is opposite to the potential of the cascade signal of the cascade signal terminal CR<N>. In this way, the output signal can be controlled in an inverted state so that the output signal satisfies the waveform of the forward shift signals of the first gate line G1 and the second gate line G2 shown in FIG. 2.

In some embodiments, as can be seen from FIG. 7, the cascade signal of the cascade signal terminal CR<N−1> of the shift register in the previous stage is at a low in the first phase, that is, the cascade signal in the previous stage has a holding time of 1H.

Figure 8:
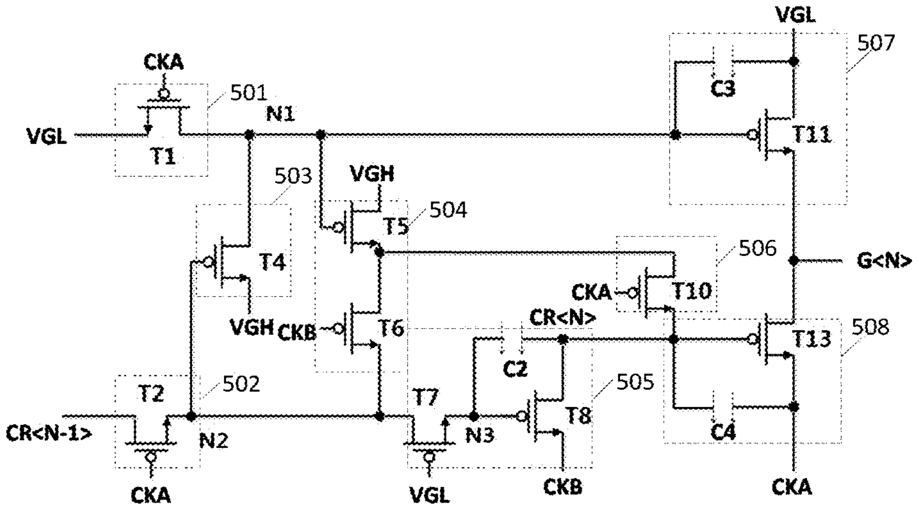
FIG. 8 is a schematic diagram of a second circuit structure of a shift register according to an embodiment of the present disclosure.

FIG. 8 is a schematic diagram of a second circuit structure of a shift register according to an embodiment of the present disclosure. As shown in FIG. 8, the structure of the shift register is similar to that shown in FIG. 6, and the first input sub-circuit 501, the second input sub-circuit 502, the second control sub-circuit 504, the first cascade sub-circuit 505, the first output sub-circuit 507, and the second output sub-circuit 508 are the same as those shown in FIG. 6. The difference from the shift register shown in FIG. 6 is that in the shift register shown in FIG. 8, the first control sub-circuit 503 includes only: a fourth transistor T4; the fourth transistor T4 has a gate electrode connected to the second node N2, a source electrode connected to the high level signal terminal VGH, and a drain electrode connected to the first node N1. The third control sub-circuit 506 only includes: a tenth transistor T10; the tenth transistor T10 has a gate electrode connected to the second clock signal terminal CKB, a source electrode connected to the drain electrode of the fifth transistor T5, and a drain electrode connected to the cascade signal terminal CR<N>. In this way, it is unnecessary to provide structures such as the fourth auxiliary transistor T4', the ninth transistor M9, the sixteenth transistor M16, the twelfth transistor M12, the fourteenth transistor M14 and the like, so that the number of transistors can be reduced, and the narrow border design is facilitated. For the operation timing and the operation principle, reference may be made to the above description of the shift register shown in FIG. 6, which will not be described in detail here.

Figure 9:
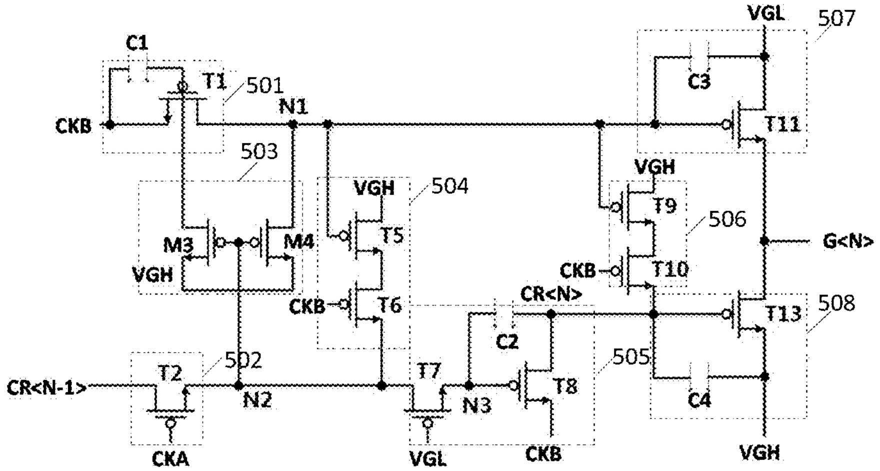
FIG. 9 is a schematic diagram of a third circuit structure of a shift register according to an embodiment of the present disclosure.

FIG. 9 is a schematic diagram of a third circuit structure of a shift register according to an embodiment of the present disclosure. As shown in FIG. 9, the structure of the shift register is similar to that shown in FIG. 6, and the second input sub-circuit 502, the second control sub-circuit 504, the first cascade sub-circuit 505, the first output sub-circuit 507, and the second output sub-circuit 508 are the same as those shown in FIG. 6. The difference from the shift register shown in FIG. 6 is that the first input sub-circuit 501 includes: a first transistor T1 and a first storage capacitor C1; the first transistor T1 has a gate electrode connected to one terminal of the first storage capacitor C1, a source electrode connected to the second clock signal terminal CKB and the other terminal of the first storage capacitor C1, and a drain electrode connected to the first node N1; the first storage capacitor C1 has one terminal connected to the gate electrode of the first transistor T1 and the other terminal connected to the second clock signal terminal CKB and the source electrode of the first transistor T1. The first control sub-circuit 503 includes: a third transistor T3 and a fourth transistor T4; the third transistor T3 has a gate electrode connected to the second node N2, a source electrode connected to the high level signal terminal VGH, and a drain electrode connected to the first input sub-circuit 501; and the fourth transistor T4 has a gate electrode connected to the second node N2, a source electrode connected to the high level signal terminal VGH, and a drain electrode connected to the first node N1. The third control sub-circuit 506 includes: a ninth transistor T9 and a tenth transistor T10; the ninth transistor T9 has a gate electrode connected to the first node N1, a source electrode connected to the high level signal terminal VGH, and a drain electrode connected to a source electrode of the tenth transistor T10; the tenth transistor T10 has a gate electrode connected to the second clock signal terminal CKB, the source electrode connected to the drain electrode of the ninth transistor T9, and a drain electrode connected to the second output sub-circuit 508 and the cascade signal terminal CR<N>.

Figure 10:
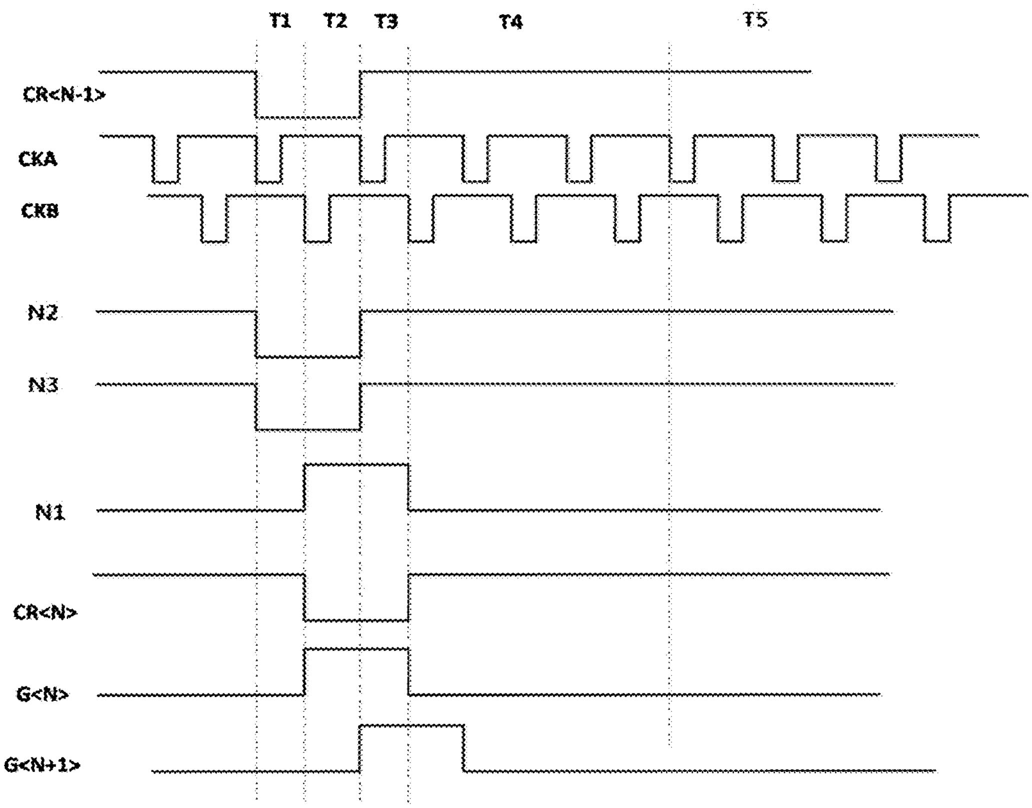
FIG. 10 is a timing diagram illustrating an operation of the shift register shown in FIG. 9.

FIG. 10 is a timing diagram illustrating an operation of the shift register shown in FIG. 9. As shown in FIG. 10, the first storage capacitor C1 is added in the first input sub-circuit 501, and has a holding effect on the voltage at the first node N1, so that a holding time of the cascade signal in the previous stage is 2H, which is 1H longer than the holding time of the effective level of the cascade signal in the previous stage in FIG. 7. For the operation timing and the operation principle, reference may be made to the above description of the shift register shown in FIG. 6, which will not be described in detail here. The operation timing shown in FIG. 10 differs from the operation timing shown in FIG. 7 in that a holding time of the output signal is also 2H, and the output signals of the shift registers of two adjacent stages overlap with each other by 1H.

Figure 11:
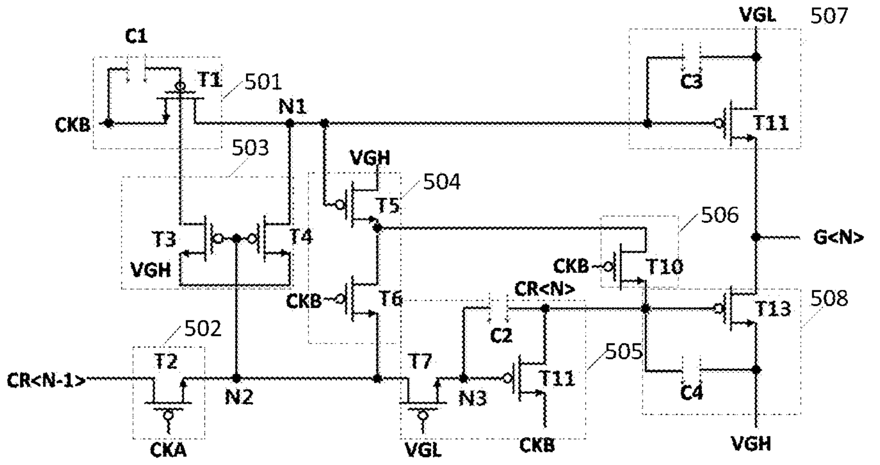
FIG. 11 is a schematic diagram of a fourth circuit structure of a shift register according to an embodiment of the present disclosure.

FIG. 11 is a schematic diagram of a fourth circuit structure of a shift register according to an embodiment of the present disclosure. As shown in FIG. 11, the structure of the shift register is similar to that shown in FIG. 9, and the first input sub-circuit 501, the second input sub-circuit 502, the first control sub-circuit 503, the second control sub-circuit 504, the first cascade sub-circuit 505, the first output sub-circuit 507, and the second output sub-circuit 508 are the same as those shown in FIG. 9. The difference is that in the shift register shown in FIG. 11, the third control sub-circuit 506 includes only: a tenth transistor T10; the tenth transistor T10 has a gate electrode connected to the second clock signal terminal CKB, a source electrode connected to the drain electrode of the fifth transistor T5, and a drain electrode connected to the cascade signal terminal CR<N>. Therefore, it is unnecessary to provide structures such as the ninth transistor M9 and the like, so that the number of transistors can be reduced, and the narrow border design is facilitated. For the operation timing and the operation principle, reference may be made to the above description of the shift register shown in FIG. 9, which will not be described in detail here.

Figure 12:
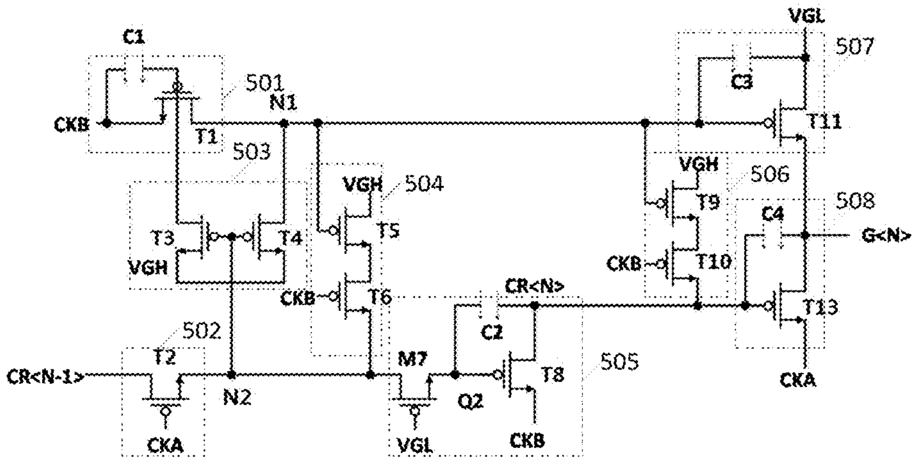
FIG. 12 is a schematic diagram of a fifth circuit structure of a shift register according to an embodiment of the present disclosure.
Figure 13:
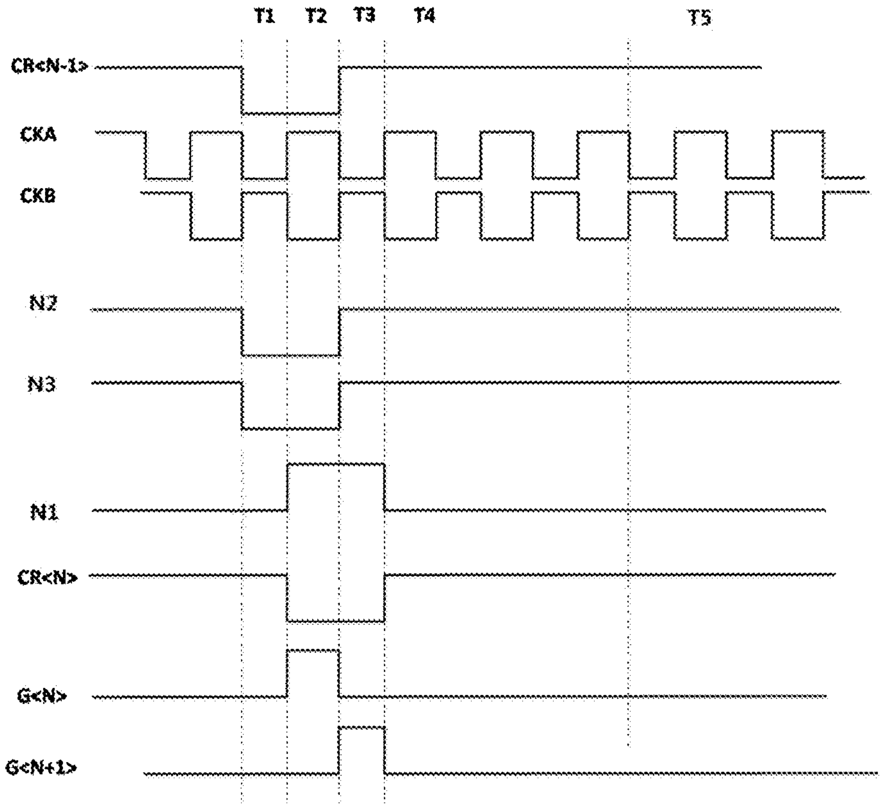
FIG. 13 is a timing diagram illustrating an operation of the shift register shown in FIG. 12.

FIG. 12 is a schematic diagram of a fifth circuit structure of a shift register according to an embodiment of the present disclosure. As shown in FIG. 12, the structure of the shift register is similar to that shown in FIG. 9, and the first input sub-circuit 501, the second input sub-circuit 502, the first control sub-circuit 503, the second control sub-circuit 504, the first cascade sub-circuit 505, the third control sub-circuit 506, and the first output sub-circuit 507 are the same as those shown in FIG. 9. The difference is that in the shift register shown in FIG. 12, the source electrode of the thirteenth transistor T13 in the second output sub-circuit 508 is connected to the first clock signal terminal CKA, rather than the high level signal terminal VGH. FIG. 13 is a timing diagram illustrating an operation of the shift register shown in FIG. 12. FIG. 13 is similar to the operation timing diagram shown in FIG. 10, and the operation principle is not described in detail. The difference is that there is no overlap between the output signals of the shift registers in two adjacent stages in FIG. 13, and the holding time of each output signal is 1H.

Figure 14:
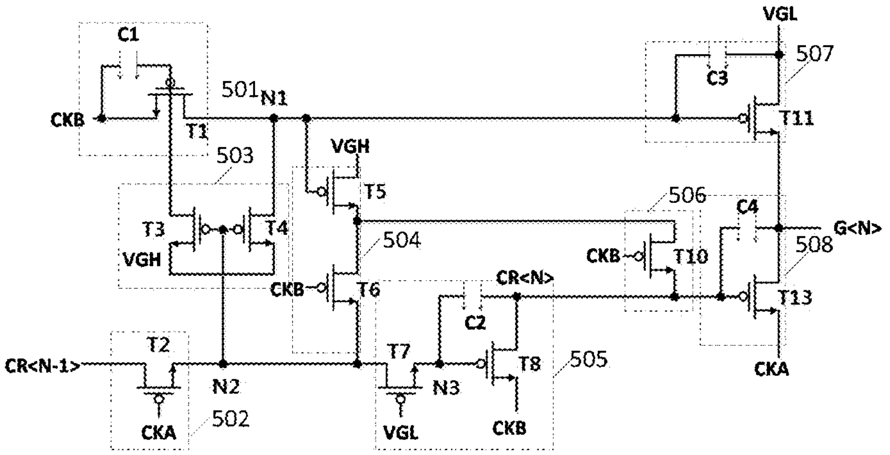
FIG. 14 is a schematic diagram of a sixth circuit structure of a shift register according to an embodiment of the present disclosure.

FIG. 14 is a schematic diagram of a sixth circuit structure of a shift register according to an embodiment of the present disclosure. As shown in FIG. 14, the structure of the shift register is similar to that shown in FIG. 12, and the first input sub-circuit 501, the second input sub-circuit 502, the first control sub-circuit 503, the second control sub-circuit 504, the first cascade sub-circuit 505, the first output sub-circuit 507, and the second output sub-circuit 508 are the same as those shown in FIG. 12. The difference is that the third control sub-circuit 506 only includes: a tenth transistor T10; the tenth transistor T10 has a gate electrode connected to the second clock signal terminal CKB, a source electrode connected to the drain electrode of the fifth transistor T5, and a drain electrode connected to the cascade signal terminal CR<N>. For the operation timing and the operation principle, reference may be made to the above description of the shift register shown in FIG. 12, which will not be described in detail here.

Figure 15:
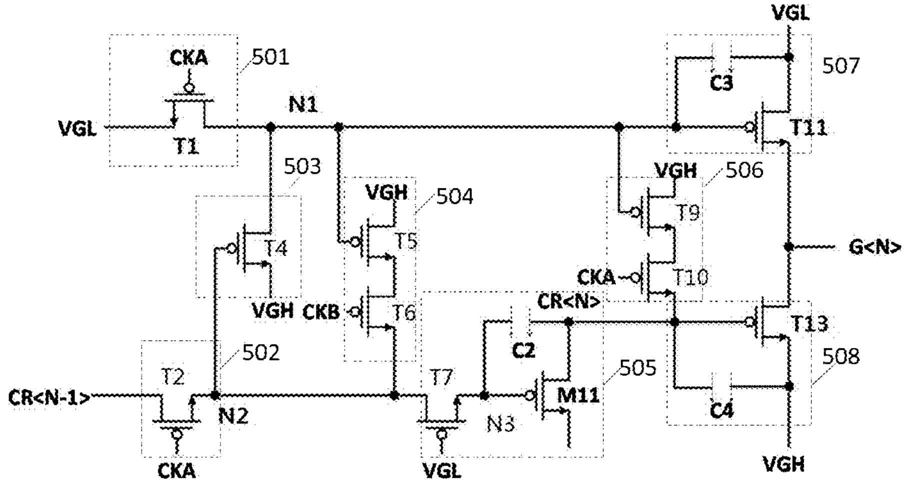
FIG. 15 is a schematic diagram of a seventh circuit structure of a shift register according to an embodiment of the present disclosure.
Figure 16:
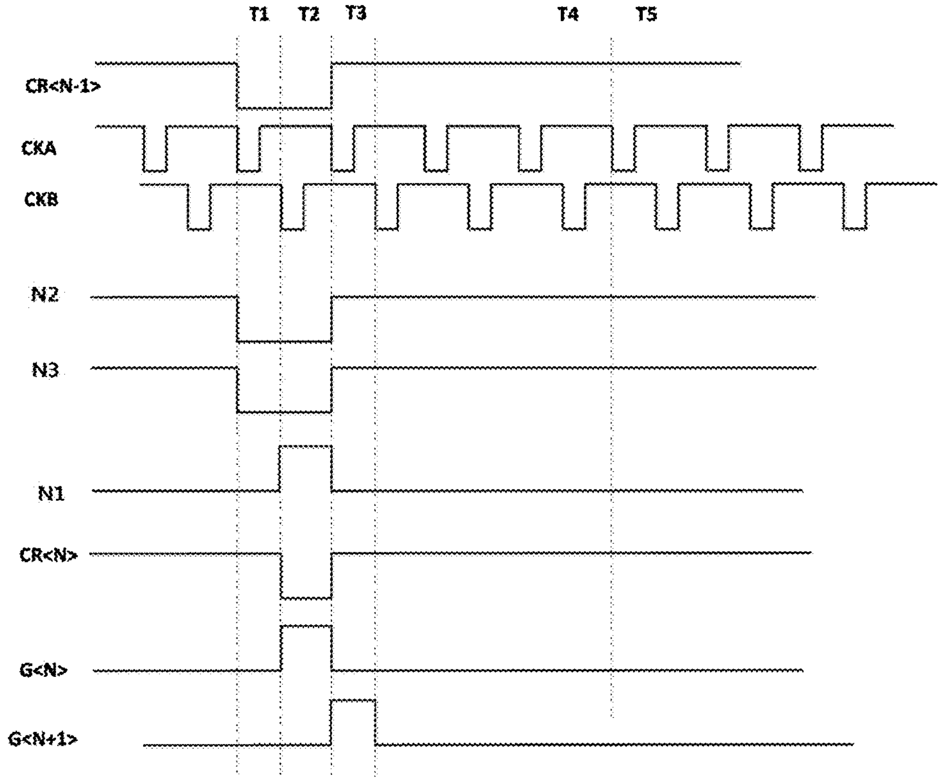
FIG. 16 is a timing diagram illustrating an operation of the shift register shown in FIG. 15.

FIG. 15 is a schematic diagram of a seventh circuit structure of a shift register according to an embodiment of the present disclosure. As shown in FIG. 15, the structure of the shift register is similar to that shown in FIG. 12, and the second input sub-circuit 502, the second control sub-circuit 504, the first cascade sub-circuit 505, the third control sub-circuit 506, the first output sub-circuit 507, and the second output sub-circuit 508 are the same as those shown in FIG. 12. The difference is that the first input sub-circuit 501 includes: a first transistor T1; the first transistor T1 has a gate electrode connected to the first clock signal terminal CKA, a source electrode connected to the low level signal terminal VGL, and a drain electrode connected to the first node N1. The first control sub-circuit 503 includes: a fourth transistor T4; the fourth transistor T4 has a gate electrode connected to the second node N2, a source electrode connected to the high level signal terminal VGH, and a drain electrode connected to the first node N1. FIG. 16 is a timing diagram illustrating an operation of the shift register shown in FIG. 15. As shown in FIG. 16, for the operation timing and the operation principle, reference may be made to the above description of the shift register shown in FIG. 6, which will not be described in detail here.

Figure 17:
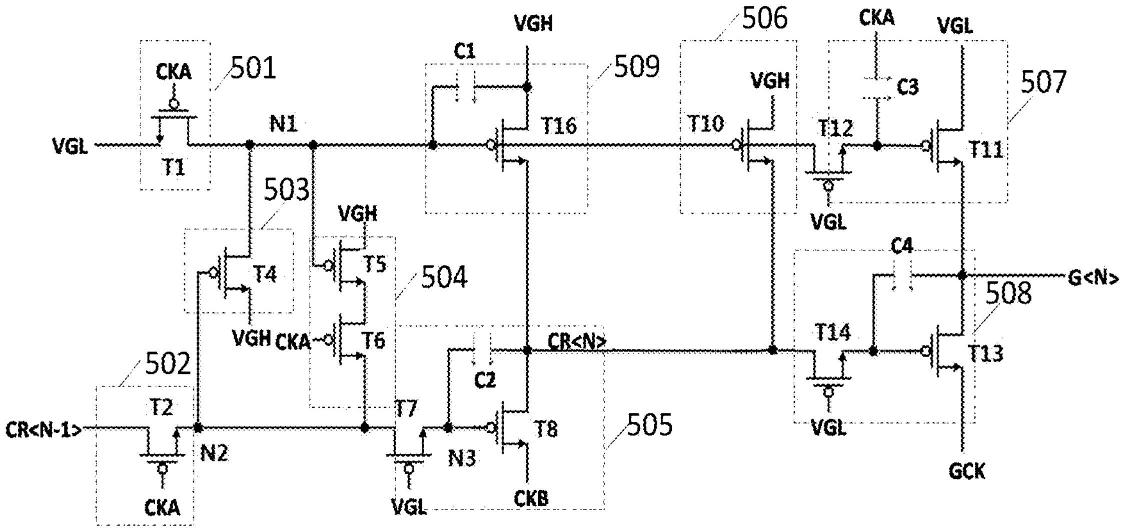
FIG. 17 is a schematic diagram of an eighth circuit structure of a shift register according to an embodiment of the present disclosure.

FIG. 17 is a schematic diagram of an eighth circuit structure of a shift register according to an embodiment of the present disclosure. As shown in FIG. 17, the structure of the shift register is similar to that shown in FIG. 15, and the first input sub-circuit 501, the second input sub-circuit 502, the first control sub-circuit 503, the second control sub-circuit 504, the first cascade sub-circuit 505, the first output sub-circuit 507, and the second output sub-circuit 508 are the same as those shown in FIG. 15. The difference is that the third control sub-circuit 506 only includes: a tenth transistor T10; the tenth transistor T10 has a gate electrode connected to the first node N1, a source electrode connected to the high level signal terminal VGH, and a drain electrode connected to the cascade signal terminal CR<N>. For the operation timing and the operation principle, reference may be made to the above description of the shift register shown in FIG. 15, which will not be described in detail here.

Figure 18:
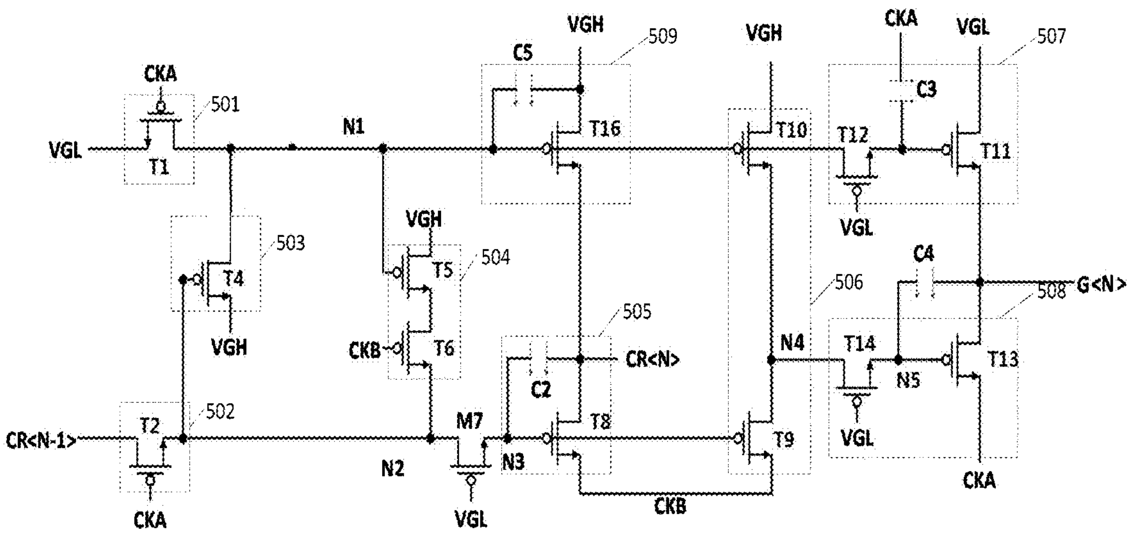
FIG. 18 is a schematic diagram of a ninth circuit structure of a shift register according to an embodiment of the present disclosure.

FIG. 18 is a schematic diagram of a ninth circuit structure of a shift register according to an embodiment of the present disclosure. As shown in FIG. 18, the structure of the shift register is similar to that shown in FIG. 6, except that it is unnecessary to provide structures such as the fourth auxiliary transistor T4' and the fifteenth transistor T15 and the like in the shift register shown in FIG. 18, so that the number of transistors can be reduced, and the narrow border design is facilitated. For the operation timing and the operation principle, reference may be made to the above description of the shift register shown in FIG. 6, which will not be described in detail here.

In a second aspect, an embodiment of the present disclosure provides a method for driving a shift register as above, and a driving procedure of the shift register includes a first phase, a second phase, a third phase, a fourth phase, and a fifth phase. The method provided by the embodiment of the present disclosure will be further described in detail below by taking the shift register shown in FIG. 6 and the timing diagram illustrating the operation of the shift register shown in FIG. 7 as an example.

In the first phase: a first clock signal and a cascade signal of the previous stage are both at a low level (an effective level), and a second clock signal is at a high level (an ineffective level). The first transistor T1 and the second transistor T2 are turned on under the control of the first clock signal, the cascade signal of the previous stage is input through the drain electrode of the second transistor T2, the low level signal is written into the second node N2, the seventh transistor T7 is turned on under the control of the low level signal, and the low level signal written into the second node N2 is continuously written into the third node N3, so that the eighth transistor T8 is turned on. The second clock signal (at a high level) is input through the drain electrode of the eighth transistor T8, and the cascade signal terminal CR<N> of the shift register outputs the high level signal. Meanwhile, the low level signal is input through the drain electrode of the first transistor T1, and is written into the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned on under the control of the voltage at the third node N3, the tenth transistor T10 is turned on under the control of the voltage at the first node N1, the second clock signal (at a high level) is input to the fourth node N4 through the drain electrode of the ninth transistor T9, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the second phase: the first clock signal and the cascade signal of the previous stage are both at a high level (an ineffective level), and the second clock signal is at a low level (an effective level). The third node N3 (under the action of the second storage capacitor C2) maintains the low level in the first phase, so that the eighth transistor T8 remains turned on, and after the second clock signal is switched, the cascade signal terminal CR<N> of the shift register outputs the low level signal at this time. Meanwhile, the second node N2 (under the action of the second storage capacitor C2) maintains the low level in the first phase, so that the fourth transistor T4 and the fourth auxiliary transistor T4' are turned on, the high level signal is input through the drain electrode of the fourth auxiliary transistor T4', and is written into the first node N1, and therefore, a voltage at the first node N1 is pulled up, and the fifth transistor T5, the sixteenth transistor T16, the tenth transistor T10 and the eleventh transistor T11 are turned off. The ninth transistor T9 is turned on under the control of the voltage at the third node N3, and the second clock signal (at a low level) is input to the fourth node N4 through the drain electrode of the ninth transistor T9. The fourteenth transistor T14 is turned on under the control of the low level signal, so that the voltage at the fourth node N4 is transmitted to the gate electrode of the thirteenth transistor T13, and the thirteenth transistor T13 is turned on. The first clock signal (at a high level) is input through the drain electrode of the thirteenth transistor T13, and the signal output terminal G<N> of the shift register outputs the high level signal.

In the third phase: the first clock signal is at a low level (an effective level), and the cascade signal and the second clock signal of the previous stage are both at a high level (an ineffective level). The first transistor T1 and the second transistor T2 are turned on under the control of the first clock signal, the cascade signal of the previous stage is input through the drain electrode of the second transistor T2, the high level signal is sequentially written into the second node N2 and the third node N3, and the eighth transistor T8 is turned off. Meanwhile, the low level signal is input through the drain electrode of the first transistor T1, and is written into the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the fourth phase: the first clock signal and the cascade signal of the previous stage are both at a high level (an ineffective level), and the second clock signal is at a low level (an effective level). The second node N2 and the third node N3 both maintain the high level in the third phase (under the action of the second storage capacitor C2), so that the eighth transistor T8, the fourth transistor T4 and the fourth auxiliary transistor T4' are turned off. The first node N1 maintains the low level in the third phase (under the action of the fifth storage capacitor C5), so that the sixteenth transistor T16 is turned on, the high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

In the fifth phase: the first clock signal is at a low level (an effective level), and the cascade signal of the previous stage and the second clock signal are both at a high level (an ineffective level). The first transistor T1 and the second transistor T2 are turned on under the control of the first clock signal, the cascade signal of the previous stage is input through the drain electrode of the second transistor T2, and the high level signal is sequentially written into the second node N2 and the third node N3, so that the eighth transistor T8 is turned off. Meanwhile, the low level signal is input through the drain electrode of the first transistor T1, and the low level signal is input to the first node N1, so that the sixteenth transistor T16 is turned on. The high level signal is input through the drain electrode of the sixteenth transistor T16, and at this time, the cascade signal terminal CR<N> of the shift register outputs the high level signal. The ninth transistor T9 is turned off under the control of the voltage at the third node N3, the tenth transistor T10 is turned on under the control of the voltage at the first node N1, and the high level signal is input to the fourth node N4 through the drain electrode of the tenth transistor T10. The fourteenth transistor T14 is turned on under the control of the low level signal, so that the voltage at the fourth node N4 is transmitted to the gate electrode of the thirteenth transistor T13, and the thirteenth transistor T13 is turned off. Meanwhile, the twelfth transistor T12 is turned on under the control of the low level signal, so that the low level signal at the first node N1 is transmitted to the gate electrode of the eleventh transistor T11, and the eleventh transistor T11 is turned on, and the low level signal is input through the drain electrode of the eleventh transistor T11, and at this time, the signal output terminal G<N> of the shift register outputs the low level signal.

Figure 19:
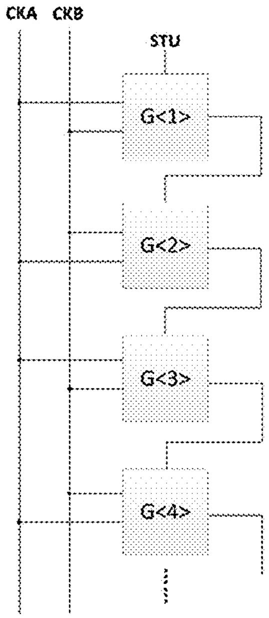
FIG. 19 is a schematic diagram of a structure of a gate driving circuit according to an embodiment of the present disclosure.

In a third aspect, an embodiment of the present disclosure provides a gate driving circuit. FIG. 19 is a schematic diagram of a structure of a gate driving circuit according to an embodiment of the present disclosure. As shown in FIG. 19, the gate driving circuit includes a plurality of cascaded shift registers in any one of the above embodiments, and a signal input terminal of the shift register in the present stage is connected to a signal output terminal of the shift register in the previous stage. The implementation principle of the gate driving circuit is similar to the operation principle of the shift register, and is not described herein again.

In a fourth aspect, an embodiment of the present disclosure provides a display apparatus, where the display apparatus includes the gate driving circuit provided in any one of the above embodiments, and the display apparatus may be any product or component with a display function, such as a television, a mobile phone, a display, a notebook computer, a digital photo frame, or a navigator or the like. The implementation principle of the display apparatus is similar to that of the shift register and the gate driving circuit, and is not described herein again.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising: a first input sub-circuit, a second input sub-circuit, a first control sub-circuit, a second control sub-circuit, a first cascade sub-circuit, a first output sub-circuit and a second output sub-circuit; wherein the first input sub-circuit is configured to transmit a second level signal to a first node in response to a first clock signal; or transmit a second clock signal to the first node in response to the second clock signal;

the second input sub-circuit is configured to transmit an input signal to a second node in response to the first clock signal;

the first control sub-circuit is configured to transmit a first level signal to the first node in response to a voltage at the second node; or transmit the first level signal to the first node and the first input sub-circuit in response to the voltage at the second node;

the second control sub-circuit is configured to transmit the first level signal to the second node in response to a voltage at the first node and the second clock signal;

the first cascade sub-circuit is configured to transmit the second clock signal to a cascade signal terminal in response to the voltage at the second node;

the first output sub-circuit is configured to transmit the second level signal to a signal output terminal in response to the voltage at the first node; and the second output sub-circuit is configured to transmit the first clock signal or the first level signal to the signal output terminal in response to a voltage at the cascade signal terminal.

2. The shift register of claim 1, wherein the first input sub-circuit comprises: a first transistor; and a control electrode of the first transistor is connected to a first clock signal terminal, a first electrode of the first transistor is connected to a second level signal terminal, and a second electrode of the first transistor is connected to the first node.

3. The shift register of claim 1, wherein the first input sub-circuit comprises: a first transistor and a first storage capacitor;

a control electrode of the first transistor is connected to one terminal of the first storage capacitor, a first electrode of the first transistor is connected to a second clock signal terminal and the other terminal of the first storage capacitor, and a second electrode of the first transistor is connected to the first node; and the one terminal of the first storage capacitor is connected to the control electrode of the first transistor, and the other terminal of the first storage capacitor is connected to the second clock signal terminal and the first electrode of the first transistor.

4. The shift register of claim 1, wherein the second input sub-circuit comprises: a second transistor; and a control electrode of the second transistor is connected to a first clock signal terminal, a first electrode of the second transistor is connected to a signal input terminal, and a second electrode of the second transistor is connected to the first control sub-circuit and the second node.

5. The shift register of claim 1, wherein the first control sub-circuit comprises: a fourth transistor and a fourth auxiliary transistor;

a control electrode of the fourth transistor is connected to the second node and a control electrode of the fourth auxiliary transistor, a first electrode of the fourth transistor is connected to a first level signal terminal, and a second electrode of the fourth transistor is connected to a first electrode of the fourth auxiliary transistor; and the control electrode of the fourth auxiliary transistor is connected to the second node and the control electrode of the fourth transistor, the first electrode of the fourth auxiliary transistor is connected to the second electrode of the fourth transistor, and a second electrode of the fourth auxiliary transistor is connected to the first node.

6. The shift register of claim 5, wherein the first control sub-circuit further comprises: a fifteenth transistor; and a control electrode of the fifteenth transistor is connected to the first node, a first electrode of the fifteenth transistor is connected to a second level signal terminal, and a second electrode of the fifteenth transistor is connected to the second electrode of the fourth transistor and the first electrode of the fourth auxiliary transistor.

7. The shift register of claim 1, wherein the first control sub-circuit comprises: a fourth transistor; and a control electrode of the fourth transistor is connected to the second node, a first electrode of the fourth transistor is connected to a first level signal terminal, and a second electrode of the fourth transistor is connected to the first node.

8. The shift register of claim 1, wherein the first control sub-circuit comprises: a third transistor and a fourth transistor;

a control electrode of the third transistor is connected to the second node, a first electrode of the third transistor is connected to a first level signal terminal, and a second electrode of the third transistor is connected to the first input sub-circuit; and a control electrode of the fourth transistor is connected to the second node, a first electrode of the fourth transistor is connected to the first level signal terminal, and a second electrode of the fourth transistor is connected to the first node.

9. The shift register of claim 1, wherein the second control sub-circuit comprises: a fifth transistor and a sixth transistor;

a control electrode of the fifth transistor is connected to the first node, a first electrode of the fifth transistor is connected to a first level signal terminal, and a second electrode of the fifth transistor is connected to a first electrode of the sixth transistor; and a control electrode of the sixth transistor is connected to a second clock signal terminal, the first electrode of the sixth transistor is connected to the second electrode of the fifth transistor, and a second electrode of the sixth transistor is connected to the second node.

10. The shift register of claim 1, wherein the first cascade sub-circuit comprises: a seventh transistor, an eighth transistor, and a second storage capacitor;

a control electrode of the seventh transistor is connected to a second level signal terminal, a first electrode of the seventh transistor is connected to the second node, and a second electrode of the seventh transistor is connected to a control electrode of the eighth transistor and one terminal of the second storage capacitor; and the control electrode of the eighth transistor is connected to the second electrode of the seventh transistor and the one terminal of the second storage capacitor, a first electrode of the eighth transistor is connected to a second clock signal terminal, and a second electrode of the eighth transistor is connected to the cascade signal terminal and the other terminal of the second storage capacitor.

11. The shift register of claim 1, wherein the first output sub-circuit comprises: an eleventh transistor and a third storage capacitor;

a control electrode of the eleventh transistor is connected to the first node and one terminal of the third storage capacitor, a first electrode of the eleventh transistor is connected to a second level signal terminal, and a second electrode of the eleventh transistor is connected to the signal output terminal; and the one terminal of the third storage capacitor is connected to the first node and the control electrode of the eleventh transistor, and the other terminal of the third storage capacitor is connected to the first electrode of the eleventh transistor and the second level signal terminal, or is connected to a first clock signal terminal;

wherein the first output sub-circuit further comprises: a twelfth transistor; and a control electrode of the twelfth transistor is connected to the second level signal terminal, a first electrode of the twelfth transistor is connected to the first node, and a second electrode of the twelfth transistor is connected to the one terminal of the third storage capacitor and the control electrode of the eleventh transistor.

12. The shift register of claim 1, wherein the second output sub-circuit comprises: a thirteenth transistor and a fourth storage capacitor;

a control electrode of the thirteenth transistor is connected to the cascade signal terminal and one terminal of the fourth storage capacitor, a first electrode of the thirteenth transistor is connected to a first clock signal terminal or a first level signal terminal, and a second electrode of the thirteenth transistor is connected to the signal output terminal and the other terminal of the fourth storage capacitor; and the one terminal of the fourth storage capacitor is connected to the cascade signal terminal and the control electrode of the thirteenth transistor, and the other terminal of the fourth storage capacitor is connected to the second electrode of the thirteenth transistor and the signal output terminal;

wherein the second output sub-circuit further comprises: a fourteenth transistor; and a control electrode of the fourteenth transistor is connected to a second level signal terminal, a first electrode of the fourteenth transistor is connected to the signal output terminal, and a second electrode of the fourteenth transistor is connected to the one terminal of the fourth storage capacitor and the control electrode of the thirteenth transistor.

13. The shift register of claim 1, wherein the shift register further comprises: a third control sub-circuit; and the third control sub-circuit is configured to transmit the first level signal to the cascade signal terminal in response to the voltage at the first node and the second clock signal.

14. The shift register of claim 13, wherein the third control sub-circuit comprises: a ninth transistor and a tenth transistor;

a control electrode of the ninth transistor is connected to the second node, a first electrode of the ninth transistor is connected to a second clock signal terminal, and a second electrode of the ninth transistor is connected to a second electrode of the tenth transistor and the second output sub-circuit; and a control electrode of the tenth transistor is connected to the first node, a first electrode of the tenth transistor is connected to a first level signal terminal, and the second electrode of the tenth transistor is connected to the second electrode of the ninth transistor and the second output sub-circuit.

15. The shift register of claim 13, wherein the third control sub-circuit comprises: a ninth transistor and a tenth transistor;

a control electrode of the ninth transistor is connected to the first node, a first electrode of the ninth transistor is connected to a first level signal terminal, and a second electrode of the ninth transistor is connected to a first electrode of the tenth transistor; and a control electrode of the tenth transistor is connected to a second clock signal terminal, the first electrode of the tenth transistor is connected to the second electrode of the ninth transistor, and a second electrode of the tenth transistor is connected to the second output sub-circuit and the cascade signal terminal.

16. The shift register of claim 13, wherein the third control sub-circuit comprises: a tenth transistor; and a control electrode of the tenth transistor is connected to a second clock signal terminal, a first electrode of the tenth transistor is connected to the second control sub-circuit, and a second electrode of the tenth transistor is connected to the second output sub-circuit and the cascade signal terminal.

17. The shift register of claim 1, wherein the shift register further comprises: a second cascade sub-circuit; and the second cascade sub-circuit is configured to transmit the first level signal to the cascade signal terminal in response to the voltage at the first node;

wherein the second cascade sub-circuit comprises: a sixteenth transistor and a fifth storage capacitor; and a control electrode of the sixteenth transistor is connected to the first node and one terminal of the fifth storage capacitor, a first electrode of the sixteenth transistor is connected to a first level signal terminal and the other terminal of the fifth storage capacitor, and a second electrode of the sixteenth transistor is connected to the cascade signal terminal.

18. A gate driving circuit, comprising a plurality of shift registers, which are cascaded together, and each of which is the shift register of claim 1, wherein the signal input terminal of the shift register in a current stage is connected to the signal output terminal of the shift register in a previous stage.

19. A display apparatus, comprising the gate driving circuit of claim 18.

20. A method for driving the shift register of claim 1, wherein the method comprises:

transmitting the second level signal to the first node in response to the first clock signal;

transmitting the input signal to the second node in response to the first clock signal;

transmitting the first level signal to the first node in response to the voltage at the second node;

transmitting the first level signal to the second node in response to the voltage at the first node and the second clock signal;

transmitting the second clock signal to the cascade signal terminal in response to the voltage at the second node;

transmitting the second level signal to the signal output terminal in response to the voltage at the first node; and transmitting the first clock signal or the first level signal to the signal output terminal in response to the voltage at the cascade signal terminal.

* * * * *